United States Patent
Goishi

[11] Patent Number: 6,061,813
[45] Date of Patent: May 9, 2000

[54] MEMORY TEST SET

[75] Inventor: Masaru Goishi, Gunma, Japan

[73] Assignee: Advantest Corporation, Tokyo, Japan

[21] Appl. No.: 09/125,312

[22] PCT Filed: Dec. 19, 1997

[86] PCT No.: PCT/JP97/04720

§ 371 Date: Aug. 13, 1998

§ 102(e) Date: Aug. 13, 1998

[87] PCT Pub. No.: WO98/27556

PCT Pub. Date: Jun. 25, 1998

[30] Foreign Application Priority Data

Dec. 19, 1996 [JP] Japan .................................. 8-339206

[51] Int. Cl.[7] .......................... G01R 31/28; G11C 29/00
[52] U.S. Cl. ............................................ 714/718; 714/743
[58] Field of Search ...................................... 714/718, 719,
714/723, 42, 738, 742, 743; 365/201

[56] References Cited

U.S. PATENT DOCUMENTS

| | | | |
|---|---|---|---|
| 5,481,671 | 1/1996 | Fujisaki | 365/201 X |
| 5,530,805 | 6/1996 | Tanabe | 714/42 |
| 5,831,989 | 11/1998 | Fujisaki | 714/723 |
| 5,841,785 | 11/1998 | Suzuki | 714/718 |
| 5,994,913 | 11/1999 | Lee | 324/765 |

FOREIGN PATENT DOCUMENTS

| | | |
|---|---|---|
| 56-73354 | 6/1981 | Japan . |
| 2-38979 | 2/1990 | Japan . |
| 3-102274 | 4/1991 | Japan . |
| 6-148278 | 5/1994 | Japan . |

*Primary Examiner*—Hoa T. Nguyen
*Attorney, Agent, or Firm*—Gallagher & Lathrop; David N. Lathrop

[57] ABSTRACT

In a memory testing apparatus capable of testing both memories of a parallel input/parallel output type and a serial input/serial output type, in case of testing the serial input/serial output type memory, failure data in read out data serially outputted from the memory are separated in bit by bit basis and are stored in a failure analysis memory at different time points in the time axis so that a failure bit position can be specified. A failure multiplexer 14 for selecting and taking out outputs from a terminal of a memory under test 10 is provided in the output side of a logical comparator 13, and a bit selector 17 is provided between the failure multiplexer and a failure analysis memory 15. When a memory under test of serial input/serial output type is tested, a serial failure data outputted from the failure multiplexer is separated by the bit selector in bit by bit basis and are supplied to the failure analysis memory at different time points in the time axis, thereby to store failure bit positions in the failure analysis memory.

5 Claims, 5 Drawing Sheets

MEMORY TEST SET

TECHNICAL FIELD

The present invention relates to a memory testing apparatus which can test either of parallel input/parallel output type memories and serial input/serial output type memories and can separately store therein positions of failure memory cells of a memory resulted from a memory test, thereby to perform a failure analysis of the tested memory.

BACKGROUND ART

An ordinary memory is constructed such that it has input terminals the number of which corresponds to the number of bits of a data to be written therein, output terminals the number of which corresponds to the number of bits of a data to be read out therefrom, and address terminals the number of which corresponds to the number of bits of an address signal, wherein parallel data and a parallel address signal are supplied to the plurality of input terminals and the plurality of address terminals respectively to store the parallel data in the memory and a parallel address signal is supplied to the address terminals to read the stored data from the plurality of the output terminals as parallel data. That is, the ordinary memory is a parallel input/parallel output type memory. Further, the address terminals are generally used in common for write and read operations of parallel data.

In a memory testing apparatus, parallel data read out of a memory under test are logically compared with parallel expected value data in logical comparator means. Parallel failure data resulted from the logical comparisons are supplied to a failure analysis memory and positions of failure memory cells of the tested memory are stored in memory cells of the failure analysis memory at cell positions thereof having their addresses corresponding to those of the cell positions of the tested memory. The information of the positions of failure memory cells and the number of failure memory cells stored in the failure analysis memory are utilized in performing a failure analysis of the tested memory and the like.

In recent years, there has been developed a memory having the least terminals possible. The memory of this type has therein a shift register train (a series of shift registers) called "SCAN chain" in this technical field. Such memory is arranged that an input terminal of the first stage shift register and an output terminal of the last stage shift register of the shift register train are led out therefrom to the outside, that an address signal and data to be written are inputted from this input terminal to the shift register train as a serial signal and are sequentially fed into input side shift registers of the shift register train, that the input data serially supplied to the shift register train are taken out from the input side shift registers in parallel and are stored in the memory for each address, that the data stored in the memory are read out in parallel thereof and are taken in output side shift registers of the shift register train as a parallel signal, and that the parallel data stored in output side shift registers are taken out from the output terminal of the last stage shift register of the shift register train as a serial signal by sequentially shifting the shift register train.

In such a way, by constructing a memory as a serial input/serial output type memory structure, there is obtained an advantage that the number of terminals of the memory can be reduced to a minimum.

FIG. 4 illustrates the internal structure of an example of the serial input/serial output type memory. In the drawing the serial input/serial output type memory which is to be a memory under test is denoted as a whole by a reference numeral 12. This memory under test 12 includes a built-in memory cell array 12A and a shift register train called SCAN chain. There are provided, in this example, four input terminals T0–T3 and four output terminals T4–T7 in the memory cell array 12A. Therefore, the shift register train is correspondingly constructed such that four shift registers R0–R3 disposed in the input side thereof and four shift registers R4–R7 disposed in the output side thereof are connected in series, an input terminal of the first stage shift register R0 is led out therefrom as an external input terminal IN, and an output terminal of the last stage shift register R7 is led out therefrom as an external output terminal OUT.

Serial data inputted from the external input terminal IN into the shift register train are fed into the four shift registers R0, R1, R2 and R3 in the input side connected in series with one another and are temporarily stored therein. After then, the temporarily stored serial data are written in the memory cell array 12A as parallel data from the shift registers R0–R3 via the four input terminals T0–T3 by a write signal and are stored therein.

Output data read out, in parallel, from the four output terminals T4–T7 of the memory cell array 12A by a read signal are temporarily stored in the corresponding shift registers R4–R7 in the output side. The read out data stored in the shift registers R4–R7 are converted to serial data by sequentially shifting the shift registers R4–R7, which serial data are outputted from the external output terminal OUT as a serial signal.

In such a manner, in case of a serial input/serial output type memory, it has only one input terminal and one output terminal, and hence the number of terminals can significantly be reduced.

FIG. 5 shows the general circuit configuration of a typical conventional memory testing apparatus which is configured such that it is capable of testing either of a serial input/serial output type memory and a parallel input/parallel output type memory. This memory testing apparatus includes a pattern generator 11 for generating a predetermined test pattern signal, an address pattern signal, an expected value data signal and the like, a logical comparator 13 for logically comparing an output data read out from a memory under test 10 with an expected value data supplied from the pattern generator 11, a failure multiplexer 14, a failure analysis memory 15, and an address selector 16.

The pattern generator 11 has a group of output terminals 11A for outputting an address pattern signal, a group of output terminals 11B for outputting a test pattern signal and a group of output terminals 11C for outputting an expected value data, and outputs, when the memory under test 10 is a parallel input/parallel output type memory, parallel address pattern signals, parallel test pattern signals and parallel expected value data signals from those output terminal groups 11A, 11B and 11C, respectively.

Output data read out from the memory under test 10 are inputted to one group of input terminals 13A of the logical comparator 13. Expected value data are supplied from the pattern generator 11 to the other group of input terminals 13B of the logical comparator 13 where the output data from the memory under test 10 are logically compared with the expected value data from the pattern generator.

The logical comparator 13 outputs a pass signal (usually a logical "0" signal) indicating that the tested memory cell is good or non-defective when the both data coincide with each other, and outputs a failure signal (usually a logical "1" signal), as a failure data, indicating that the tested memory cell is defective or failure when the both data do not coincide with each other. The failure data is sent to a failure multiplexer 14, and the failure data from one of the terminals of the memory under test 10 selected by the failure multiplexer 14 is inputted to the failure analysis memory 15 and is stored in a memory cell of the failure analysis memory 15 having the same address as that of the failure memory cell of the memory under test 10. The failure multiplexer 14 selects one of the terminals of the memory under test 10 the failure data from which is taken in the failure analysis memory 15 for each bit of the failure analysis memory 15. In addition, an address pattern signal outputted from the pattern generator 11 is supplied to the memory under test 10 and, at the same time, is also supplied to the failure analysis memory 15 via an address selector 16. Therefore, the failure data can be stored in a memory cell of the failure analysis memory 15 having the same address as that of the failure memory cell of the memory under test 10.

Now, functions of the address selector 16 and the failure multiplexer 14 will be described.

A memory testing apparatus needs to be able to test memories having various storage capacities. Therefore, the storage capacity of a memory under test 10 is not fixed and hence, the memory testing apparatus tests various memories having their storage capacities from small to large storage capacities. On the other hand, the storage capacity of the failure analysis memory 15 is determined depending upon the machine type of a memory testing apparatus and is fixed. Therefore, a case may occur that the storage capacity of the failure analysis memory 15 will be smaller than that of the memory under test 10.

Even in such case, in order to make it possible that the test results can be stored in the failure analysis memory 15, the memory testing apparatus is arranged such that the output terminals of the memory under test 10 the test results from which are to be stored in the failure analysis memory 15 can be selected by the failure multiplexer 14. That is, the memory testing apparatus is arranged such that only the logical comparison results from the output terminals of the memory under test 10 specified by the failure multiplexer 14 can be inputted to the failure analysis memory 15. Accordingly, in order to match the range of the terminals of the memory under test 10 to be selected with the range of addresses, the address selector 16 also selects the bits of the address signal, thereby to specify the address range.

The above explanation is with respect to the operations in testing an ordinary parallel input/parallel output type memory. Next, operations in testing a serial input/serial output type memory will be described.

In case of testing a serial input/serial output type memory, the pattern generator 11 outputs a serial address pattern signal, a serial test pattern signal and a serial expected value data signal from one output terminal of the output terminal group 11A, from one output terminal of the output terminal group 11B and from one output terminal of the output terminal group 11C, respectively.

The logical comparator 13 logically compares serial data outputted from the memory under test 10 with serial expected value data and the logical comparison results (failure data) are inputted to the failure analysis memory 15 via the failure multiplexer 14. Therefore, the failure data form a serial signal. This serial failure data is supplied to one input terminal of the failure analysis memory 15 as data from one terminal of the memory under test selected by the failure multiplexer 14.

A serial address pattern signal outputted from one output terminal of the address signal output terminal group 11A of the pattern generator 11 is converted, if necessary, in the address selector 16 from a serial signal to parallel signals. The parallel address signals are supplied to address input terminals of the failure analysis memory 15 to access an address of the failure analysis memory 15.

As mentioned above, in case of testing a serial input/serial output type memory by use of a conventional memory testing apparatus, a serial failure data is directly supplied to the failure analysis memory 15 in the form of a serial signal and this serial failure data is written in memory cells each having one bit one data for one memory cell at respective addresses of the failure analysis memory 15. Therefore, there occurs a disadvantage that a bit position where a failure has occurred (a cell position where a failure has occurred in memory cells) of the tested memory cannot be specified and hence cannot be stored in the failure analysis memory 15 in the state that the failure bit position has been specified.

That is, since a serial failure data constituted by a plurality of bits aligned in the direction of time series is sequentially stored in memory cells, each having one bit, of the failure analysis memory, there occurs an disadvantage that even if a logical "1" indicating a failure is written in one memory cell of the failure analysis memory 15, it is impossible to specify in which bit of the memory the failure indicated by this logical "1" has been occurred. As a result, there is a drawback that it takes a long time to test a serial input/serial output type memory and to specify a failure position of the memory.

DISCLOSURE OF THE INVENTION

It is an object of the present invention to provide a memory testing apparatus which can test both of the memories of serial input/serial output type and parallel input/parallel output type, and even in case of testing a serial input/serial output type memory, can store in a failure analysis memory a bit of the memory at which a failure has occurred in the state that the bit has been specified.

In accordance with the present invention, in order to accomplish the above object, there is provided a memory testing apparatus comprising: pattern generator means for outputting parallel address pattern signals, parallel test pattern signals and parallel expected value data signals to a memory under test of parallel input/parallel output type as well as outputting a serial address pattern signal, a serial test pattern signal and a serial expected value data signal to a memory under test of serial input/serial output type; logical comparator means for comparing an output from a memory under test with an expected value data supplied from the pattern generator means; a failure multiplexer for selecting and taking out failure data of a desired bit among failure data each indicating a failure cell position of the memory under test outputted from the logical comparator means; a failure analysis memory for storing therein the failure data taken out by the failure multiplexer; and bit selector means inserted between the failure multiplexer and the failure analysis memory for converting, in case of testing the memory under test of serial input/serial output type, a serial failure data outputted from the failure multiplexer into failure data separated in bit address by bit address basis to store the separated failure data in the failure analysis memory.

In a preferred embodiment, the bit selector means comprising: a plurality of AND gates the number of which is equal to the number of addresses set in the direction of time axis in one test cycle; a plurality of coincidence detecting circuits the number of which corresponds to the number of the AND gates; and a plurality of bit selection registers for setting bit positions in the coincidence detecting circuits, respectively, the number of the bit selection registers corresponding to the number of the coincidence detecting circuits.

In addition, the failure multiplexer selects as its input terminal, in case of testing a memory under test of serial input/serial output type, an output terminal among a plurality of output terminals of the logical comparator means, which corresponds to an output terminal of the memory under test, and connects the selected input terminal to a plurality of output terminals of the failure multiplexer.

The memory testing apparatus further includes an address selector for selecting an input terminal of the failure analysis memory into which a failure data is to be written, and wherein bit addresses in the time axis direction affixed to output data read out of the memory under test are supplied from the address selector to the coincidence detecting circuits.

Furthermore, bit addresses in the time axis direction affixed to output data read out of the memory under test are previously set in the bit selection registers.

Therefore, according to the present invention, even in case that a serial input/serial output type memory has been tested, the position of a failure memory cell where a failure has been occurred can be stored in a failure analysis memory. Consequently, there is obtained an advantage that the position of a failure memory cell can be analyzed even in case of a serial input/serial output type memory.

BEST MODES FOR CARRYING OUT THE INVENTION

Figure 1:
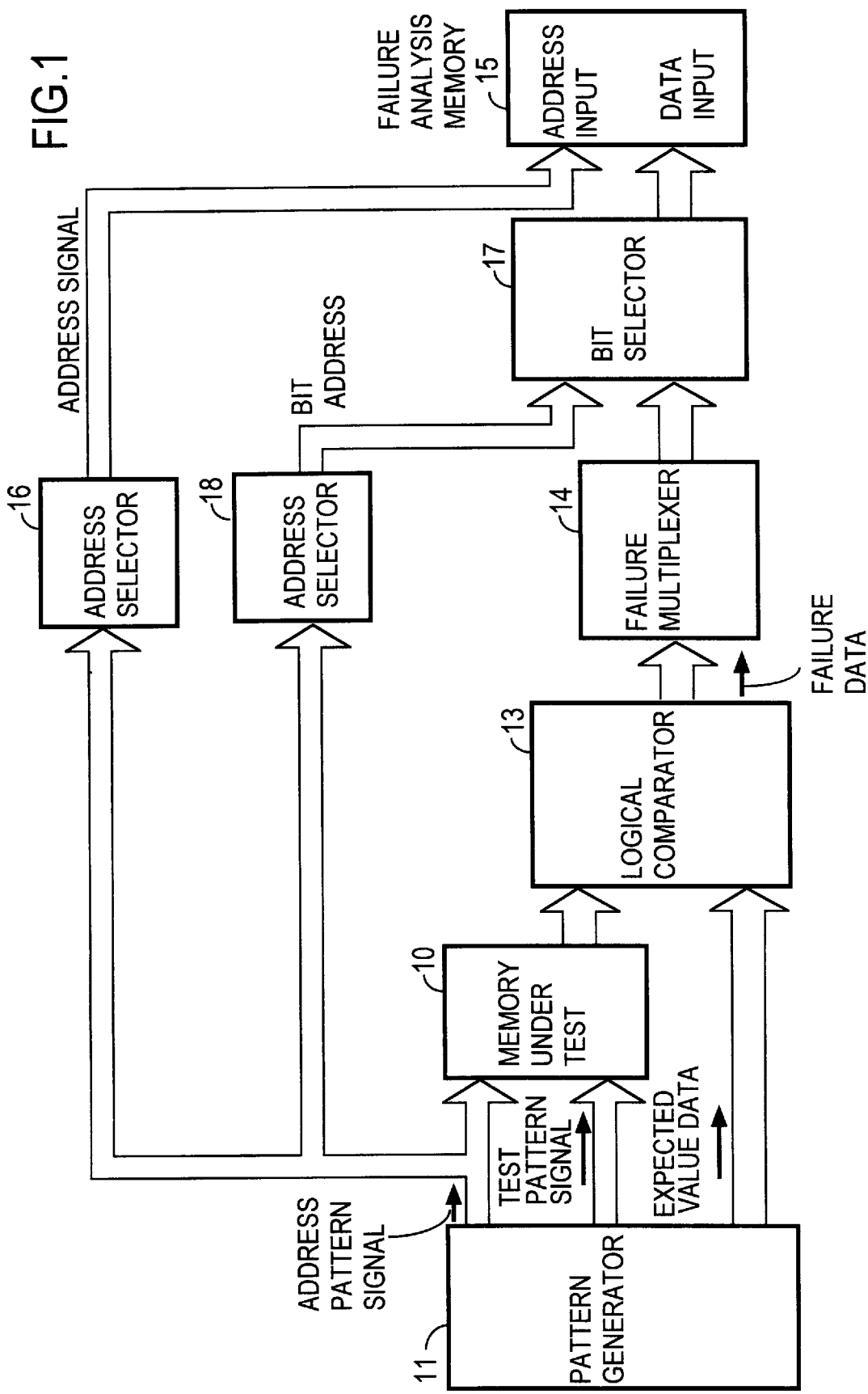
FIG. 1 is a block diagram showing an embodiment of the memory testing apparatus according to the present invention.
Figure 5:
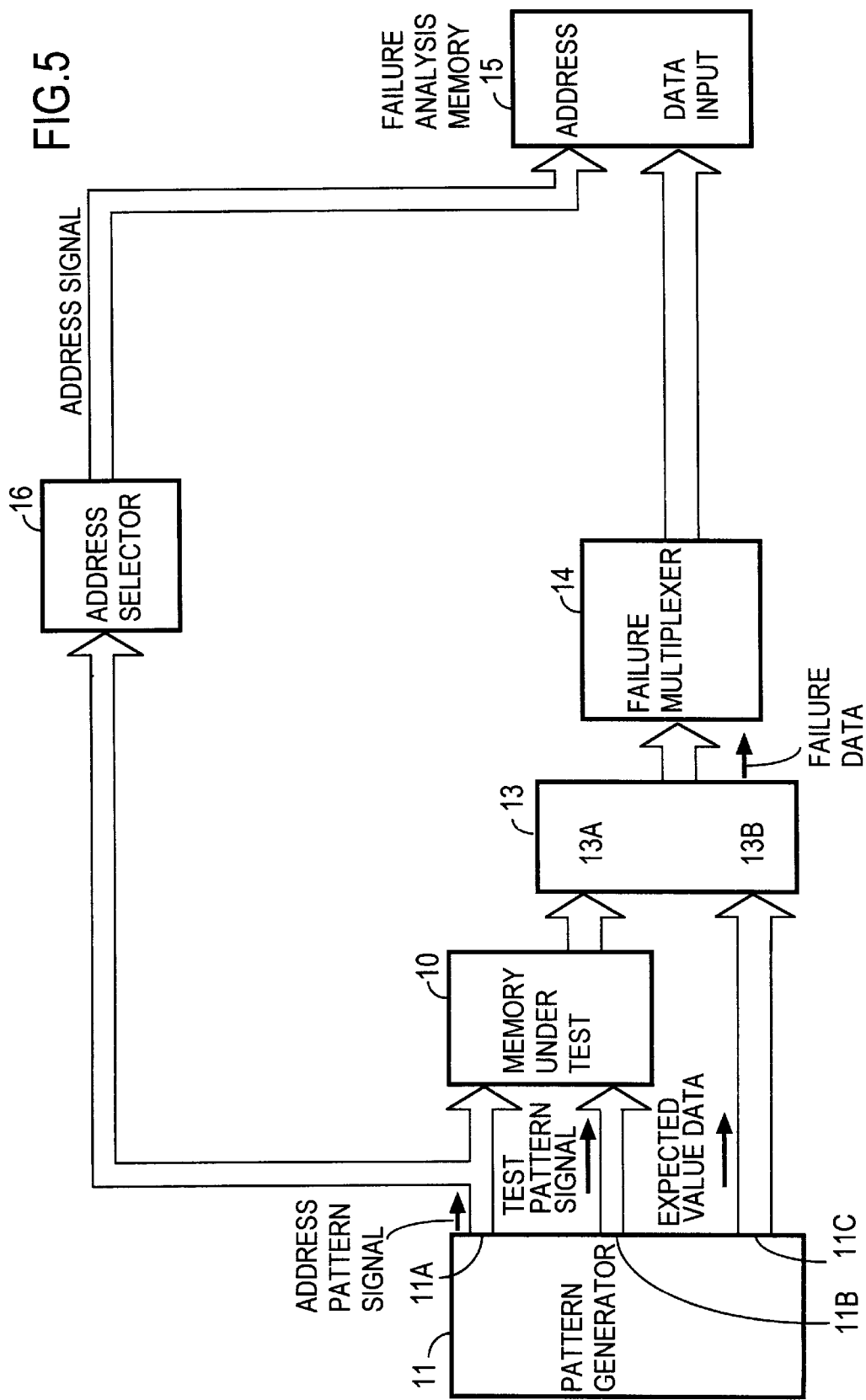
FIG. 5 is a block diagram showing an example of the conventional memory testing apparatus capable of testing both memories of a serial input/serial output type and a parallel input/parallel output type.

FIG. 1 is a block diagram showing an embodiment of the memory testing apparatus according to the present invention. Further, in order to simplify the explanation thereof, portions or elements in FIG. 1 corresponding to those in FIG. 5 are denoted by the same reference characters as those in FIG. 5, and the explanation thereof will be omitted unless necessary. Like the conventional memory testing apparatus already discussed with reference to FIG. 5, the memory testing apparatus in this embodiment also includes a pattern generator 11 for generating a predetermined test pattern signal, an address pattern signal, an expected value data signal and the like, a logical comparator 13 for logically comparing an output data read out from a memory under test 10 with an expected value data supplied from the pattern generator 11, a failure multiplexer 14, a failure analysis memory 15, and an address selector 16.

Figure 2:
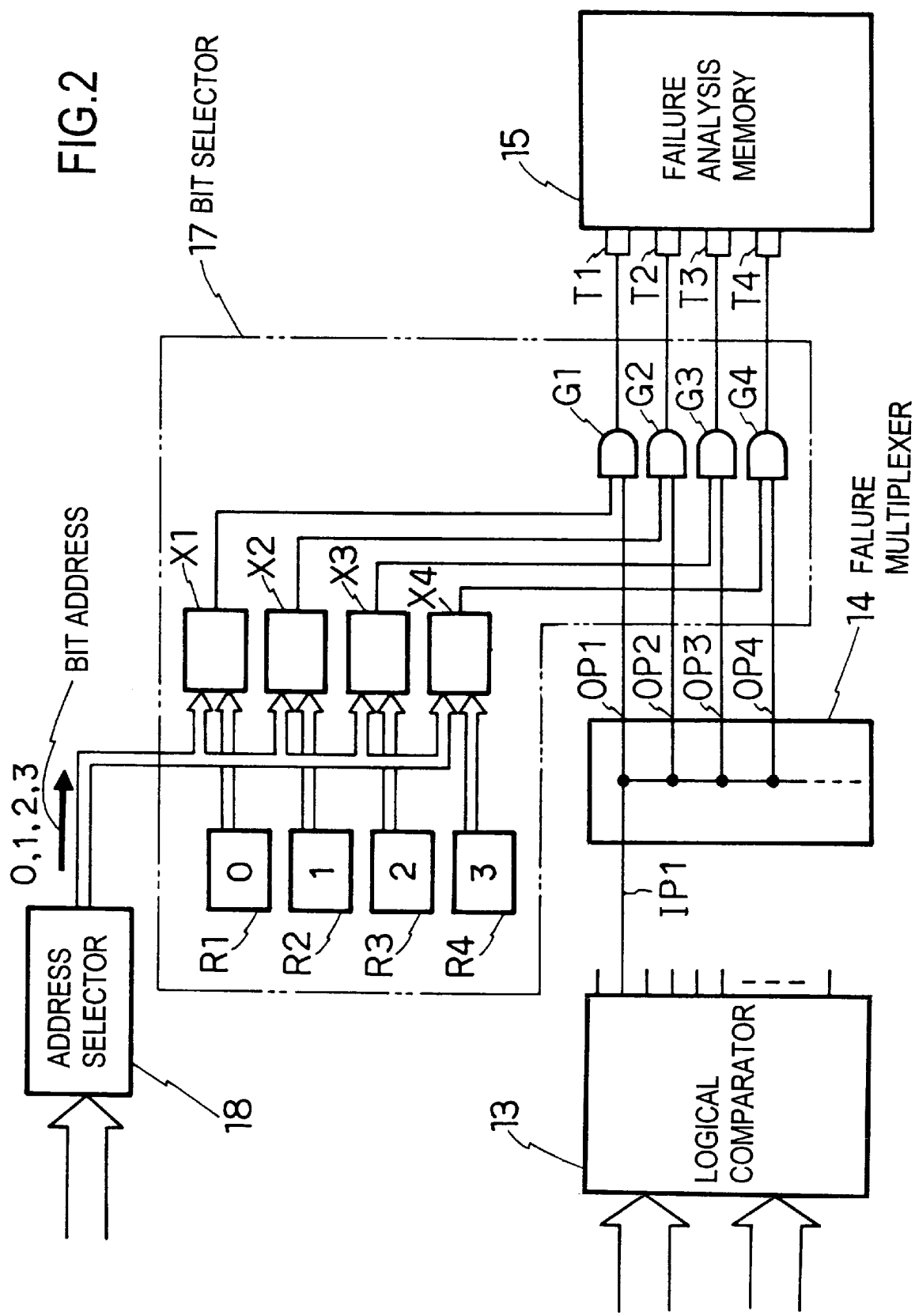
FIG. 2 is a block diagram showing in detail a construction of the essential part of the memory testing apparatus shown in FIG. 1.

In this embodiment, the memory testing apparatus is characterized in that a bit selector 17 is provided between the failure multiplexer 14 and the failure analysis memory 15. This bit selector 17 may comprise, as shown in FIG. 2 for example, a plurality of (four in this example) AND gates G1, G2, G3, . . . , a plurality of coincidence detecting circuits X1, X2, X3, . . . , the number of which corresponds to the number of the AND gates, and a plurality of bit selection registers R1, R2, R3, . . . , the number of which corresponds to the number of the coincidence detection circuits, for setting bit positions in the coincidence detection circuits X1, X2, X3, . . . , respectively.

Figure 3:
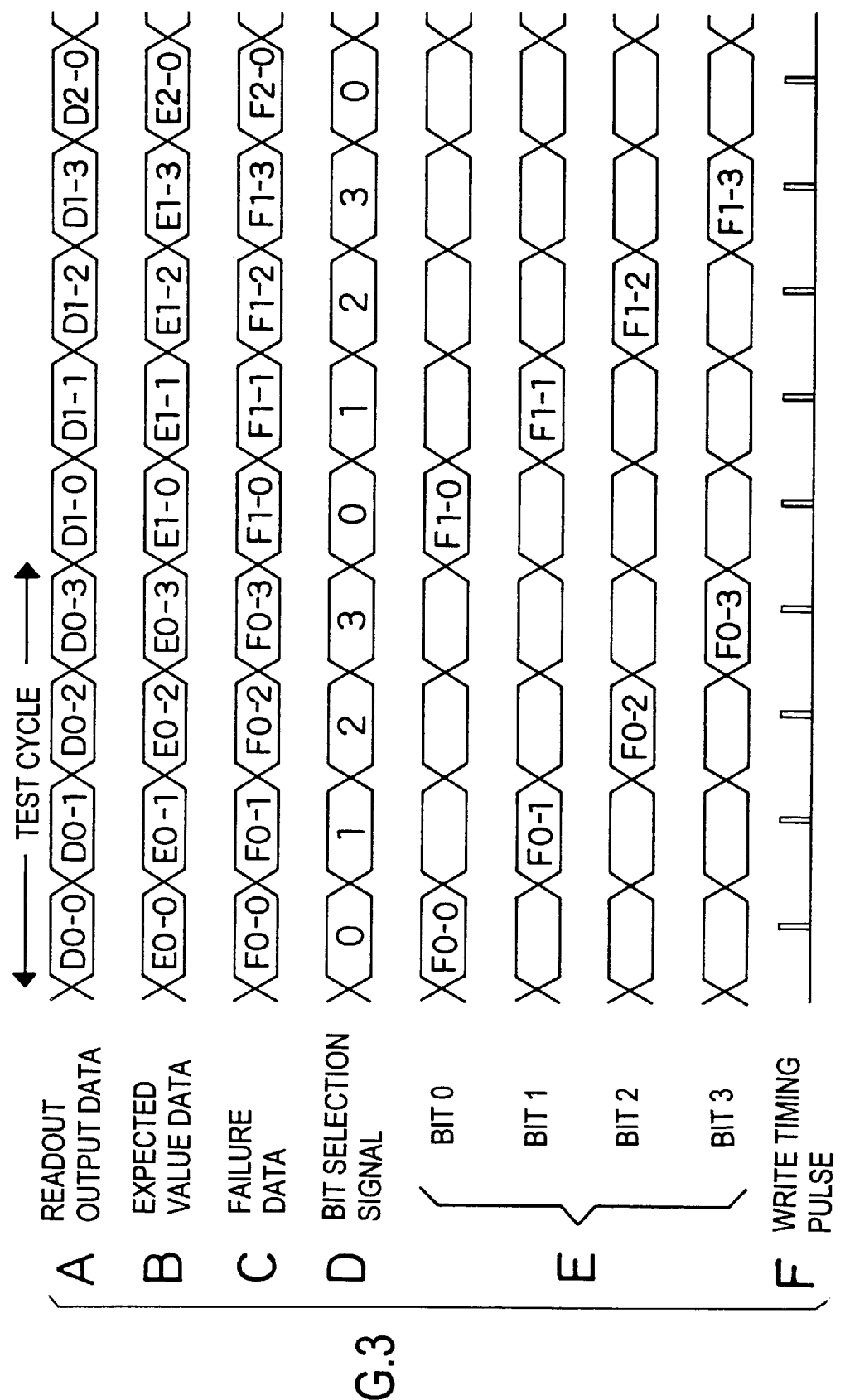
FIG. 3 is a timing chart for explaining the operation of the essential part shown in FIG. 2.
Figure 4:
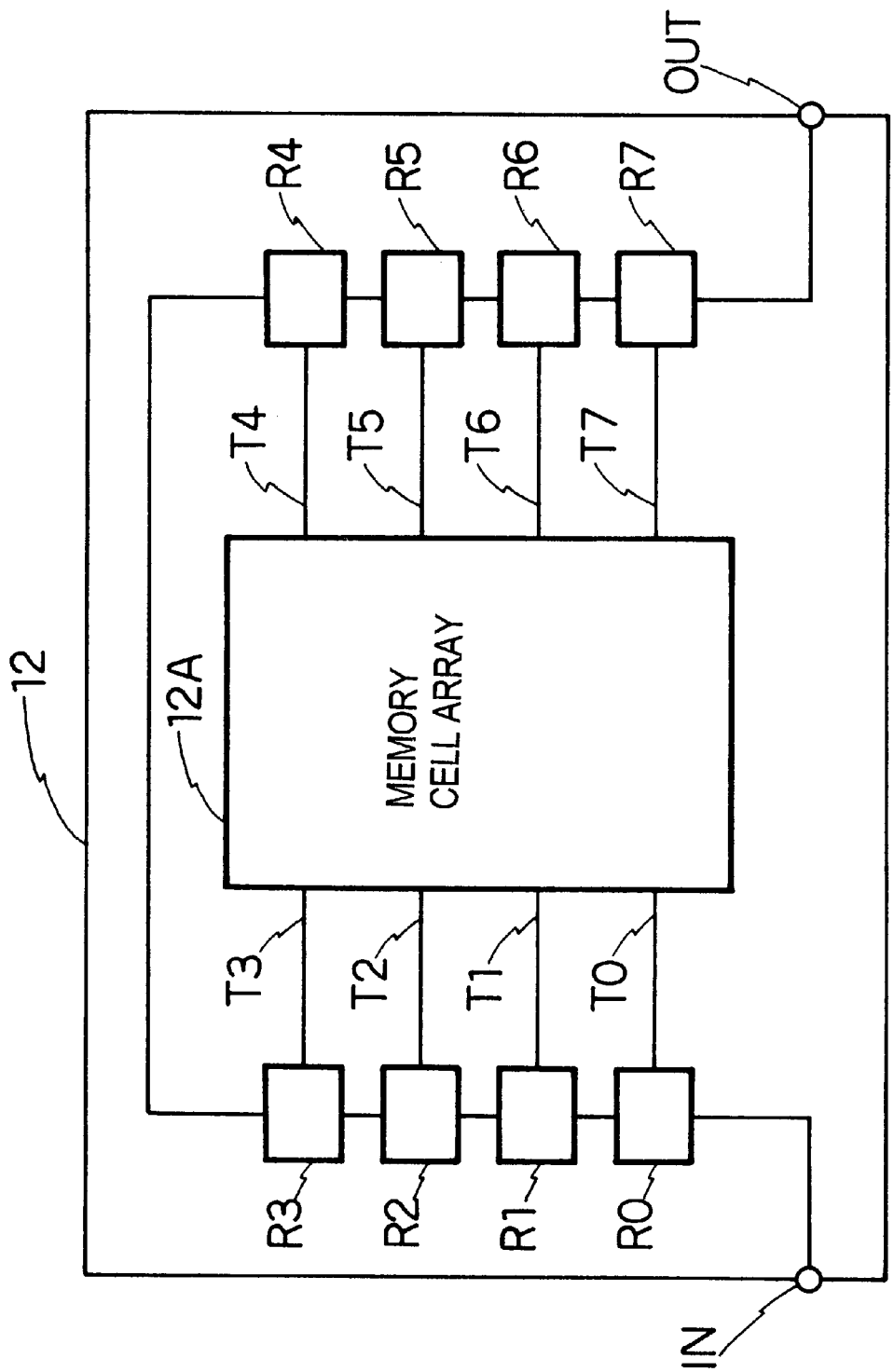
FIG. 4 is a block diagram for explaining the internal structure of an example of the serial input/serial output type memory.

In this embodiment, as shown in FIG. 3, a case is shown in which four addresses 0, 1, 2 and 3 are set in the direction of time axis during one test cycle. Accordingly, the AND gates, the coincidence detecting circuits, and the bit selection registers constituting the bit selector 17 are constructed by four gates G1–G4, four circuits X1–X4 and four registers R1–R4, respectively.

In the state that a serial input/serial output type memory is tested, the failure multiplexer 14 is set to select an output terminal among the output terminals of the logical comparator 13, which corresponds to an output terminal of the memory under test 10 as an input terminal and to connect the selected input terminal IP1 to a plurality of output terminals OP1, OP2, OP3, . . . of the failure multiplexer 14. In this embodiment, since four addresses are set in the time axis direction during one test cycle, the output terminals of the failure multiplexer 14 are also four, that is, output terminals OP1–OP4.

The output terminals OP1–OP4 to which the input terminal of the failure multiplexer 14 is connected are correlated with input terminals (bit positions) of the failure analysis memory 15 through which failure data are to be written in address areas of the failure analysis memory 15 selected by an address selector 18.

Therefore, failure data F0-0, F0-1, F0-2, F0-3, . . . outputted from the logical comparator 13 as shown in FIG. 3C are consecutively supplied to each of the output terminals OP1–OP4 of the failure multiplexer 14, and each of the failure data F0-0, F0-1, F0-2, F0-3, is supplied to one input terminals of all of the AND gates G1, G2, G3 and G4.

Bit addresses 0, 1, 2 and 3 which are bit addresses in the time series direction affixed to respective data D0-0, D0-1, D0-2 and D0-3 read out of the memory under test 10 (numerals succeeding to "–" of the respective data) are previously set in the bit selection registers R1, R2, R3 and R4, respectively, and these preset values are supplied to one input terminals of the corresponding coincidence detecting circuits X1, X2, X3 and X4, respectively.

Bit addresses 0, 1, 2 and 3 affixed to the respective output data D0-0, D0-1, D0-2 and D0-3 read out of the memory under test 10 are supplied from the address selector 18 to the other input terminals of the respective coincidence detecting circuits X1–X4. When the bit address outputted from the address selector 18 is "0", a coincidence detection signal of logical "1" is outputted from the coincidence detecting circuit X1. Since this coincidence detection signal is supplied only to the AND gate G1, the AND gate G1 is enabled (turned on). As a result, a failure data F0-0 being outputted from the logical comparator 13 at this time is supplied to an input terminal T1 of the failure analysis memory 15 corresponding to the first bit thereof.

When the bit address outputted from the address selector 18 is "1", a coincidence detection signal of logical "1" is outputted from the coincidence detecting circuit X2 and is supplied only to the AND gate G2. As a result, the AND gate G2 is turned on and a failure data F0-1 is passed therethrough and supplied to an input terminal T2 of the failure analysis memory 15 corresponding to the second bit thereof.

Similarly, when the bit address of the address selector 18 is "2", only the AND gate G3 is turned on and a failure data F0-2 is supplied to an input terminal T3 of the failure analysis memory 15 corresponding to the third bit thereof. When the bit address outputted from the address selector 18 is "3", only the AND gate G4 is turned on and a failure data F0-3 is supplied to an input terminal T4 of the failure analysis memory 15 corresponding to the fourth bit thereof.

In such a way, failure data F0-0, F0-1, F0-2 and F0-3 are separated in bit by bit basis and are inputted to the failure analysis memory 15 via the different input terminals of the failure analysis memory 15. The failure analysis memory 15 starts to perform a write operation in the memory 15 based on a write timing pulse shown in FIG. 3F.

Further, the failure analysis memory 15 conventionally has a read/write function and also has a function for inhibiting a failure data from being further written in a bit address position where a failure data of logical "1" indicating a failure has been already written. Therefore, the failure analysis memory 15 is constructed such that even if the failure data F0-0, F0-1, F0-2 and F0-3 are written in the failure analysis memory 15 in one test cycle by sequentially shifting the write timings of the failure data in the time axis direction based on the write timing pulses shown in FIG. 3F, the failure data are inhibited from being written in a bit position where a logical "1" indicating a failure has been already written, and any failure data already stored therein is not erased.

On the other hand, in case of testing a parallel input/parallel output type memory, a bit address "0" is set in each of the bit selection registers R1, R2, R3 and R4. By this setting, the gates G1–G4 are turned to be on (enabled) at every time in each test cycle. Thus, parallel failure data are inputted to the failure analysis memory 15 in each test cycle and are stored therein.

As described above, according to the present invention, a memory testing apparatus capable of testing both memories of parallel input/parallel output type and serial input/serial output type is constructed such that the test results (failure data) of a serial input/serial output type memory are separated in bit by bit basis by the bit selector 17 and are supplied to the failure analysis memory 15 to store them therein. Therefore, even in case of a serial input/serial output type memory, a failure bit position or positions can be separately stored in the failure analysis memory 15.

Consequently, there is obtained an advantage that during the failure analysis of a serial input/serial output type memory, an operation of specifying a failure bit position can be performed in a short time.

What is claimed is:

1. A memory testing apparatus comprising:

pattern generator means for outputting parallel address pattern signals, parallel test pattern signals and parallel expected value data signals to a memory under test of parallel input/parallel output type as well as outputting a serial address pattern signal, a serial test pattern signal and a serial expected value data signal to a memory under test of serial input/serial output type;

logical comparator means for comparing an output from a memory under test with an expected value data supplied from said pattern generator means;

a failure multiplexer for selecting and taking out failure data of a desired bit among failure data each indicating a failure cell position of the memory under test outputted from said logical comparator means;

a failure analysis memory for storing therein the failure data taken out by said failure multiplexer; and bit selector means inserted between said failure multiplexer and said failure analysis memory for converting, in case of testing said memory under test of serial input/serial output type, a serial failure data outputted from said failure multiplexer into failure data separated in bit address by bit address basis to store the separated failure data in said failure analysis memory.

2. The memory testing apparatus according to claim 1, wherein said bit selector means comprising:

a plurality of AND gates the number of which is equal to the number of addresses set in the direction of time axis in one test cycle;

a plurality of coincidence detecting circuits the number of which corresponds to the number of said AND gates; and a plurality of bit selection registers for setting bit positions in said coincidence detecting circuits, respectively, the number of said bit selection registers corresponding to the number of said coincidence detecting circuits.

3. The memory testing apparatus according to claim 1, wherein said failure multiplexer selects as its input terminal, in case of testing a memory under test of serial input/serial output type, an output terminal among a plurality of output terminals of said logical comparator means, which corresponds to an output terminal of the memory under test, and connects the selected input terminal to a plurality of output terminals of said failure multiplexer.

4. The memory testing apparatus according to claim 2, further comprising an address selector for selecting an input terminal of said failure analysis memory into which a failure data is to be written, and wherein bit addresses in the time axis direction affixed to output data read out of the memory under test are supplied from said address selector to said coincidence detecting circuits.

5. The memory testing apparatus according to claim 1, wherein bit addresses in the time axis direction affixed to output data read out of the memory under test are previously set in said bit selection registers.

* * * * *